United States Patent
Tanaka et al.

(10) Patent No.: US 10,673,458 B2
(45) Date of Patent: Jun. 2, 2020

(54) METHOD AND DEVICE FOR PROCESSING SIGNAL

(71) Applicant: FURUNO ELECTRIC CO., LTD., Nishinomiya, Hyogo (JP)

(72) Inventors: Keisuke Tanaka, Nishinomiya (JP); Eikoh Gotoh, Nishinomiya (JP)

(73) Assignee: FURUNO ELECTRIC COMPANY LIMITED, Nishinomiya (JP)

( * ) Notice: Subject to any disclaimer, the term of this patent is extended or adjusted under 35 U.S.C. 154(b) by 217 days.

(21) Appl. No.: 15/926,960

(22) Filed: Mar. 20, 2018

(65) Prior Publication Data
US 2018/0278265 A1 Sep. 27, 2018

(30) Foreign Application Priority Data
Mar. 22, 2017 (JP) ................. 2017-055254

(51) Int. Cl.
*H03M 7/30* (2006.01)
*H03M 5/02* (2006.01)
*G01S 7/292* (2006.01)
*G01S 7/32* (2006.01)

(52) U.S. Cl.
CPC ........... *H03M 7/3062* (2013.01); *G01S 7/292* (2013.01); *H03M 5/02* (2013.01); *G01S 7/32* (2013.01); *H03M 7/3053* (2013.01)

(58) Field of Classification Search
CPC ............ G01S 7/32; G01S 7/292; H03M 5/02; H03M 7/3062; H03M 2201/835; H03M 7/3053
See application file for complete search history.

(56) References Cited

U.S. PATENT DOCUMENTS

| 4,021,805 A | * | 5/1977 | Effinger | ................ G01S 7/2813 342/94 |
| 2009/0296789 A1 | | 12/2009 | Watanabe et al. | |
| 2009/0303835 A1 | * | 12/2009 | Asada | ................... G01S 15/104 367/93 |
| 2012/0262332 A1 | * | 10/2012 | Ohnishi | .................... G01S 7/32 342/135 |

FOREIGN PATENT DOCUMENTS

| EP | 0546188 A1 | * | 6/1993 | .......... G01S 13/288 |
| JP | 2009-288038 A | | 12/2009 | |
| JP | 2010-243295 A | | 10/2010 | |
| JP | 2012-220449 A | | 11/2012 | |

* cited by examiner

*Primary Examiner* — Timothy X Pham
(74) *Attorney, Agent, or Firm* — Studebaker & Brackett PC

(57) ABSTRACT

A signal processing device is provided, which includes a pulse compressing module configured to generate a pulse compressed signal obtained by performing pulse compression on a reception signal that is a reflection of a transmission signal transmitted to outside the device, a pseudo signal generating module configured to generate, based on the reception signal, a pseudo signal of which a pseudo main lobe portion corresponding to a main lobe of the pulse compressed signal has a lower signal level than signal levels of pseudo side lobe portions corresponding to side lobes of the pulse compressed signal, and a side lobe removing module configured to remove the pseudo signal from the pulse compressed signal.

14 Claims, 7 Drawing Sheets

METHOD AND DEVICE FOR PROCESSING SIGNAL

CROSS-REFERENCE TO RELATED APPLICATION(S)

This application claims priority under 35 U.S.C. § 119 to Japanese Patent Application No. 2017-055254, which was filed on Mar. 22, 2017, the entire disclosure of which is hereby incorporated by reference.

TECHNICAL FIELD

The present disclosure generally relates to a signal processing device which analyzes a reception signal by performing pulse compression thereon.

BACKGROUND

Conventionally, in radar apparatuses, underwater detection devices, etc., signal processing devices which perform a detection around the device by transmitting a transmission signal, receiving a reception signal, and analyzing the reception signal are known. This kind of signal processing device may perform pulse compression on the reception signal to improve an S/N ratio. JP2012-220449A discloses this kind of signal processing device.

The signal processing device of JP2012-220449A performs pulse compression on a reception signal received from a radar antenna to generate a pulse compressed signal. The signal processing device also calculates a moving average value of an envelope of the reception signal to generate a pseudo signal of side lobes of the pulse compressed signal. The signal processing device removes the pseudo signal of the side lobes from the pulse compressed signal. Thus, side lobes included in the pulse compressed signal can be removed.

However, in the processing described in JP2012-220449A, by removing the pseudo signal of the side lobes calculated as described above from the pulse compressed signal, the signal level of a main lobe of the pulse compressed signal lowers and the S/N ratio drops.

SUMMARY

The purpose of the present disclosure mainly relates to providing a signal processing device, which prevents a drop of an S/N ratio of a main lobe while removing side lobes from a pulse compressed signal.

According to a first aspect of the present disclosure, a signal processing device with the following configuration is provided. That is, the signal processing device may include a pulse compressing module, a pseudo signal generating module, and a side lobe removing module. The pulse compressing module may generate a pulse compressed signal obtained by performing pulse compression on a reception signal that is a reflection of a transmission signal transmitted to outside the device. The pseudo signal generating module may generate, based on the reception signal, a pseudo signal of which a pseudo main lobe portion corresponding to a main lobe of the pulse compressed signal has a lower signal level than signal levels of pseudo side lobe portions corresponding to side lobes of the pulse compressed signal. The side lobe removing module may remove the pseudo signal from the pulse compressed signal.

According to a second aspect of the present disclosure, the following method of processing a signal is provided. That is, the method of processing a signal may include generating a pulse compressed signal obtained by performing pulse compression on a reception signal that is a reflection of a transmission signal externally transmitted, generating, based on the reception signal, a pseudo signal of which a pseudo main lobe portion corresponding to a main lobe of the pulse compressed signal has a lower signal level than signal levels of pseudo side lobe portions corresponding to side lobes of the pulse compressed signal, and removing the pseudo signal from the pulse compressed signal.

Thus, since the signal level of the pseudo main lobe portion of the pseudo signal is lower than those of the pseudo side lobe portions, by removing the pseudo signal from the pulse compressed signal, the lowering of the signal level of the main lobe may be prevented, while removing the side lobes from the pulse compressed signal. Therefore, the drop of an S/N ratio of the main lobe of the pulse compressed signal may be prevented.

BRIEF DESCRIPTION OF DRAWINGS

The present disclosure is illustrated by way of example and not by way of limitation in the figures of the accompanying drawings, in which like reference numerals indicate like elements and in which.

DETAILED DESCRIPTION

Figure 1:
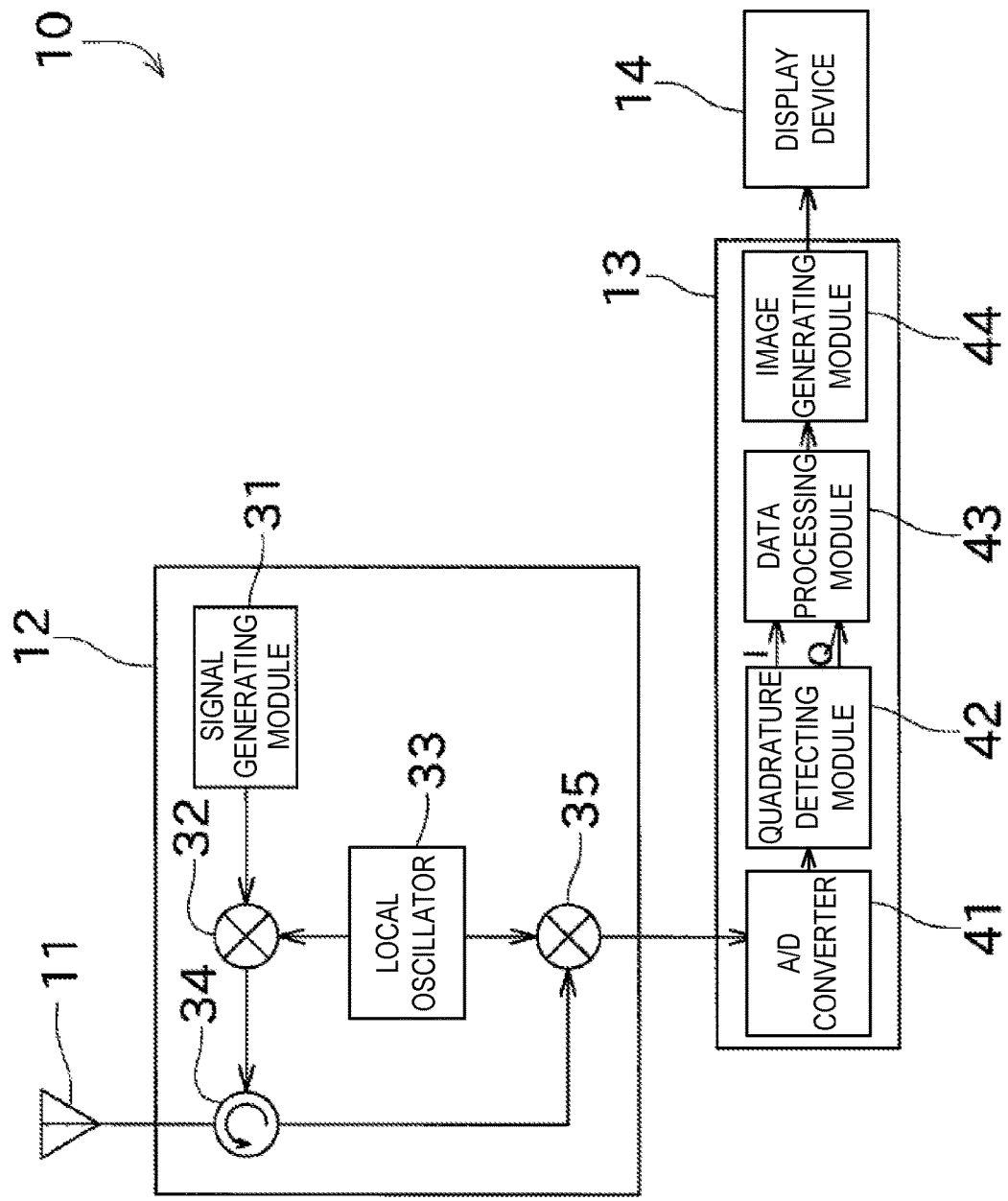
FIG. 1 is a block diagram of a radar apparatus including a signal processing device according to one embodiment of the present disclosure.

One embodiment of the present disclosure is described with reference to the accompanying drawings. In the following embodiment, an example is illustrated in which this disclosure is applied to a ship. However, the present disclosure may be applied to any kinds of vehicles having a rudder or a similar steering device, such as other watercrafts including boats, vessels, and submarines, as well as land vehicles, airplanes and spaceships. FIG. 1 is a block diagram of a radar apparatus 10 including a signal processing device 13 according to the embodiment of the present disclosure.

The radar apparatus 10 of this embodiment may be a radar apparatus for a ship. The radar apparatus 10 may transmit a pulse-shaped transmission signal (pulse signal, electromagnetic wave) generated by a semiconductor element, to outside the apparatus. The radar apparatus 10 may also receive a reflection of the transmission signal, analyze this reflection by performing pulse compression etc. thereon, and thus detect a position etc. of a target object. Note that the transmission signal may alternatively be generated by, for example, a magnetron instead of a semiconductor element.

As illustrated in FIG. 1, the radar apparatus 10 may include a radar antenna 11, a transmission-reception unit 12, the signal processing device 13, and a display device 14.

The radar antenna 11 may transmit the transmission signal to the outside and receive the reflection of the transmission signal from a target object located therearound. Hereinafter, the reflection received by the radar antenna 11 may be referred to as the reception signal. The radar antenna 11 may repeat the transmission and reception of the electromagnetic wave while rotating at a given cycle in a horizontal plane. The radar apparatus 10 may thus detect the target object around a ship on which the radar apparatus 10 is mounted (hereinafter, simply referred to as "the ship").

Note that a radar apparatus which does not rotate its radar antenna may alternatively be used. For example, a radar apparatus having antenna elements in all circumferential directions, a radar apparatus which only detects a specific direction, such as forward, etc., are not required to rotate a radar antenna. Additionally, the radar apparatus 10 may transmit and receive the radio wave with one radar antenna, or may have a transmission radar antenna and a reception radar antenna.

The transmission-reception unit 12 and the signal processing device 13 may perform processing, such as a control (transmission control, reception control, analysis control, etc.) regarding the radar apparatus 10. In this embodiment, various components constituting the transmission-reception unit 12 may be disposed in a housing of the radar antenna 11 (on the antenna side) and various components constituting the signal processing device 13 may be disposed in a housing of the display device 14 (on an instruction unit side). Note that the components constituting the transmission-reception unit 12 and the signal processing device 13 may alternatively be disposed in either of the housings of the radar antenna 11 and the display device 14 or a separate housing therefrom.

The transmission-reception unit 12 may include a signal generating module 31, a transmission mixer 32, a local oscillator 33, a transmission-reception switch 34, and a reception mixer 35.

The signal generating module 31 may generate a transmission signal having a given waveform by specifying a pulse width, a modulation mode (a frequency modulation width and a frequency change mode) etc. This transmission signal may be converted from a digital signal into an analog signal by, for example, a D/A converter and then outputted to the transmission mixer 32. Note that the signal generating module 31 may generate a transmission trigger signal which is a signal defining a transmission period for transmitting the transmission signal and a reception period for receiving the reception signal.

The transmission mixer 32 may be supplied a local oscillation signal from the local oscillator 33. The transmission mixer 32 may raise a frequency of the transmission signal to a given transmission frequency by mixing this local oscillation signal with the transmission signal. The transmission signal with the raised frequency by the transmission mixer 32 may be amplified in signal level by an amplifier (not illustrated) and then outputted to the transmission-reception switch 34.

The transmission-reception switch 34 may switch the transmission of the transmission signal and the reception of the reception signal therebetween. For example, when transmitting the transmission signal to the outside, the transmission-reception switch 34 may output the transmission signal outputted from the transmission mixer 32 to the radar antenna 11. Thus, the transmission signal may be transmitted to the outside. On the other hand, when receiving the reflection from the outside, the transmission-reception switch 34 may output the reflection (reception signal) received from the radar antenna 11 to a reception-side circuit.

The reception signal outputted by the transmission-reception switch 34 may be amplified by the amplifier etc. and then outputted to the reception mixer 35. Similar to the transmission mixer 32, the reception mixer 35 may be supplied a local oscillation signal from the local oscillator 33. The reception mixer 35 may lower a frequency of the reception signal by mixing the reception signal with the local oscillation signal. The reception signal with the lowered frequency by the reception mixer 35 may be outputted to the signal processing device 13.

As illustrated in FIG. 1, the signal processing device 13 may include an A/D converter 41, a quadrature detecting module 42, a data processing module 43, and an image generating module 44.

The A/D converter 41 may convert the reception signal inputted from the reception mixer 35 of the transmission-reception unit 12 from an analog signal to a digital signal, and output it to the quadrature detecting module 42.

The quadrature detecting module 42 may branch the inputted reception signal into two lines, and change the phase of only one of the signals by 90° to generate complex signals comprised of an I signal and a Q signal from one signal. The quadrature detecting module 42 may output the generated I and Q signals to the data processing module 43.

The data processing module 43 may perform given processing on the I and Q signals to compress a pulse width and remove side lobes (described later in detail). The data processing module 43 may output a processed signal, which is the reception signal after processed, to the image generating module 44.

The image generating module 44 may generate a radar image based on the processed signal inputted from the data processing module 43. For example, the image generating module 44 may acquire a distance from the radar antenna 11 to the target object based on a time difference between a timing at which the radar antenna 11 transmits the pulse signal and a timing at which the reflection of the pulse signal is received. Further, the image generating module 44 may obtain a direction in which the target object is located based on the orientation of the radar antenna 11 when transmitted the pulse signal. Thus, the image generating module 44 may generate the radar image graphically showing the position of the target object located around the ship. The image generating module 44 may output the generated radar image to the display device 14.

Here, some of parts constituting the transmission-reception unit 12 and the signal processing device 13 (e.g., the signal generating module 31, the data processing module 43 and the image generating module 44) may be achieved by an arithmetic processor such as an FPGA, an ASIC, or a CPU. For example, the signal generating module 31 etc. may include a memory, such as a ROM, storing program(s) etc., and the function of the signal generating module 31 etc. may be achieved by the arithmetic processor reading and executing the program(s) stored in the memory. Moreover, the signal generating module 31 etc. may individually be configured by separate hardware or at least partially be configured by the same hardware.

The display device 14 may display electronic data. The display device 14 may display the radar image inputted from the image generating module 44. The display device 14 may be a liquid crystal display, but it may alternatively be a different type of display (e.g., organic EL display).

Figure 2:
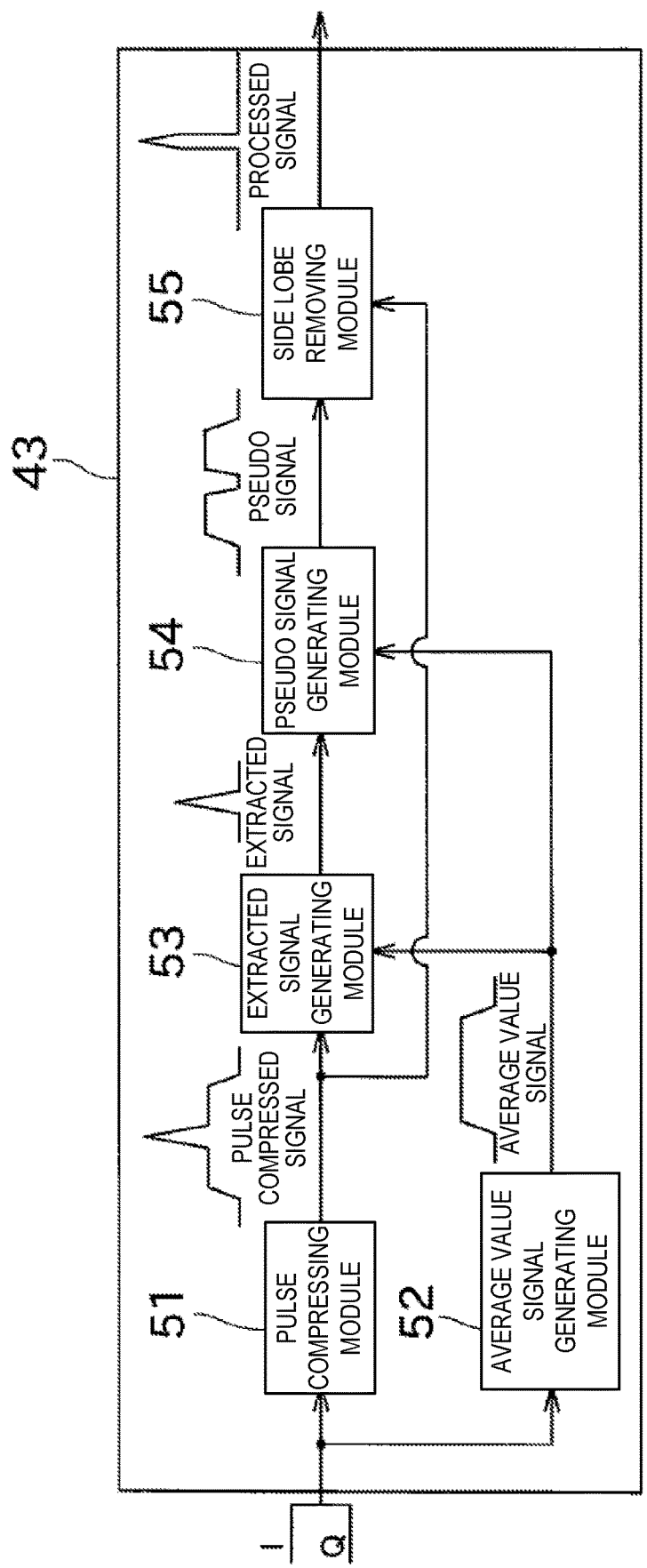
FIG. 2 is a block diagram illustrating a detailed configuration of a data processing module.
Figure 3:
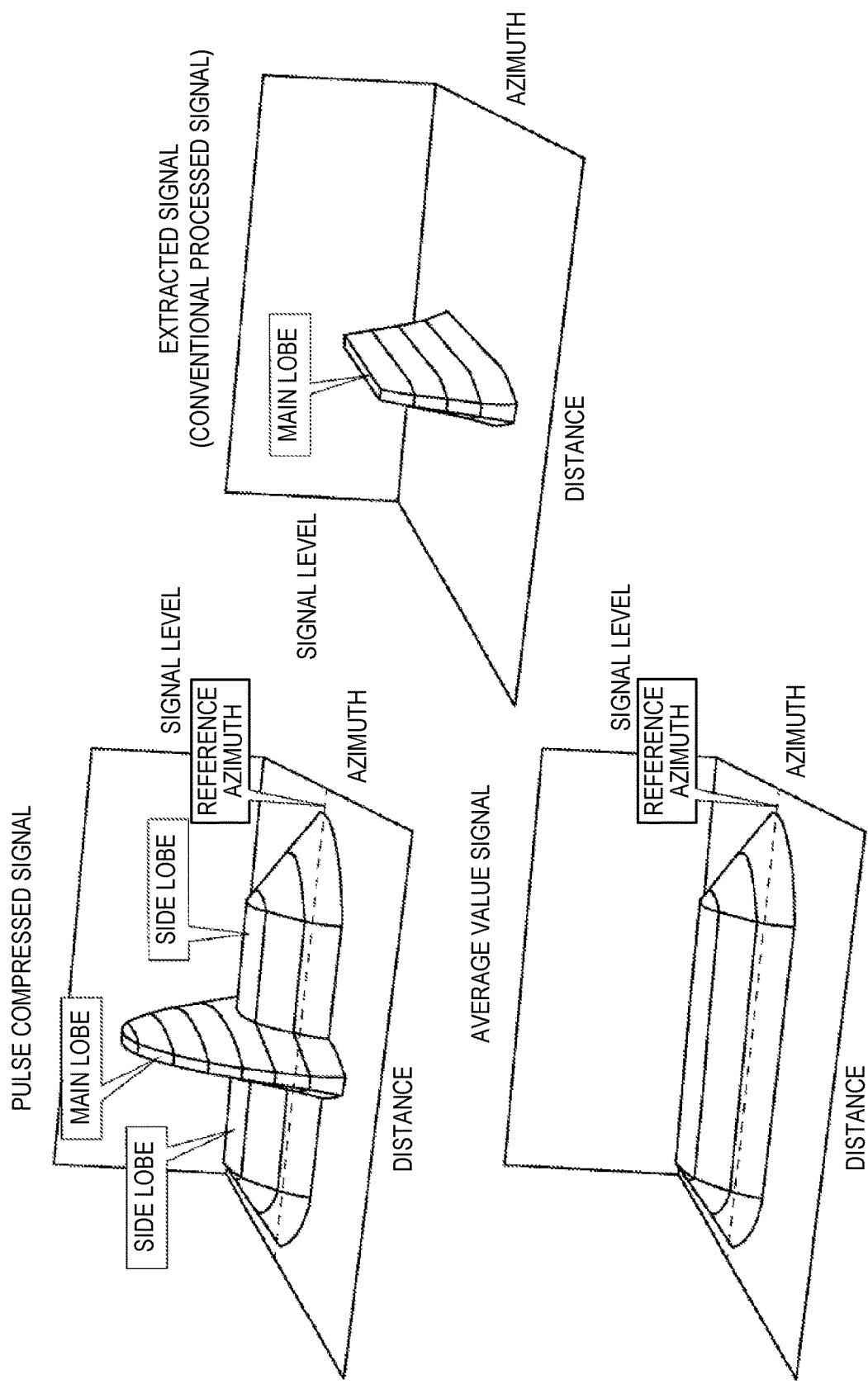
FIG. 3 is a diagram illustrating signal levels of a pulse compressed signal, an average value signal, and an extracted signal, and spreads thereof in a distance direction and an azimuth direction.
Figure 4:
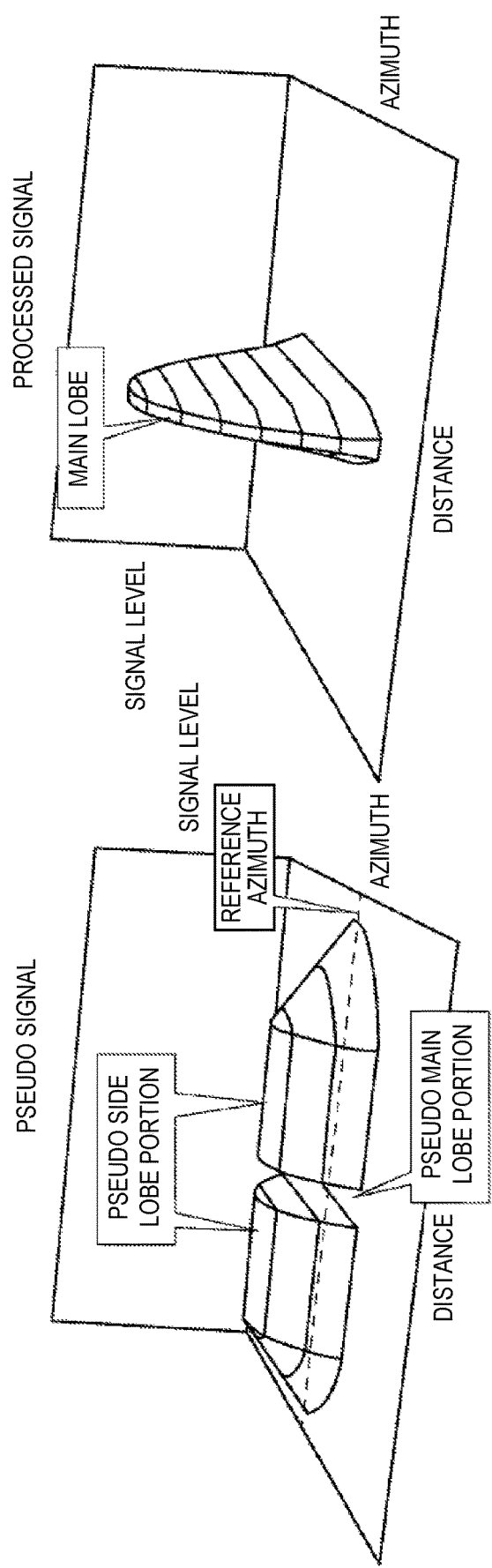
FIG. 4 is a diagram illustrating signal levels of a pseudo signal and a processed signal, and spreads thereof in the distance direction and the azimuth direction.

Next, processing performed by the data processing module 43 will be described with reference to FIGS. 2 to 4. FIG. 2 is a block diagram illustrating a detailed configuration of the data processing module 43. FIGS. 3 and 4 are diagrams illustrating, regarding each signal generated by the data processing module 43, signal levels and spreads in a distance direction and an azimuth direction.

As illustrated in FIG. 2, the data processing module 43 may include a pulse compressing module 51, an average value signal generating module 52, an extracted signal generating module 53, a pseudo signal generating module 54, and a side lobe removing module 55.

The pulse compressing module 51 may take in the I and Q signals and perform processing for compressing the pulse width (pulse compression) to generate a pulse compressed signal. Thus, even in a case of transmitting a pulse signal at a low signal level, it is possible to obtain data with a high S/N ratio.

FIG. 3 illustrates the signal level of the pulse compressed signal, and spreads thereof in the distance direction and the azimuth direction. As illustrated in FIG. 3, by performing the pulse compression, side lobes in which the signal spread in the distance direction may be generated in addition to a main lobe. The main lobe may have a peak value of the signal level at a given azimuth (hereinafter, this azimuth is referred to as "the reference azimuth"). The main lobe may have a shape in which the signal level decreases from the reference azimuth in the azimuth direction. On the other hand, the side lobes may extend in the distance direction from the position of the main lobe. Each side lobe may have a shape in which the signal level gradually decreases from the reference azimuth in the azimuth direction. The side lobe may cause an echo to be displayed in an expanded shape or a fake image to be displayed when the radar image is generated. Therefore, it is preferable to leave the main lobe while removing the side lobe from the pulse compressed signal.

The average value signal generating module 52 may take in the I and Q signals and, for example, calculate an absolute value of each of the I and Q signals to calculate an envelope. Note that the method of calculating the envelope is arbitrary, and for example, an envelope detector which outputs an envelope by detecting an analog reception signal may be used. The average value signal generating module 52 may calculate a moving average value by performing the following calculations on the calculated absolute value (envelope). Note that "x(t)" is a function indicating the absolute value described above, "T" is a pulse width, and "α" is a given coefficient (a rate of a moving average to the pulse width). Further, although in this embodiment the average value may be calculated by calculating the moving average (simple moving average), the average value may alternatively be obtained by calculating a weighted average so as to be closer to the waveform of the side lobe. Here, the weight may be increased more toward a latest signal. Note that, the average value calculated using the weighted average may be processed similarly to the average value calculated using the moving average.

$$\overline{x(t)} = \frac{\int x(t)dt}{TT} \quad (1)$$

$$TT = T\alpha$$

By calculating the average value and performing signal processing in this manner as needed, the average value signal generating module 52 may generate an average value signal. FIG. 3 illustrates the signal level of the average value signal, and spreads thereof in the distance direction and the azimuth direction. As illustrated in FIG. 3, since the average value signal may approximate a signal obtained by removing the main lobe from the pulse compressed signal. For example, the average value signal may have a shape in which the signal level gradually decreases throughout the distance direction from the reference azimuth in the azimuth direction, similarly to the side lobe of the pulse compressed signal. Therefore, in JP2012-220449A, this average value signal is used as the pseudo signal of the side lobes. However, also in the portion corresponding to the main lobe of the pulse compressed signal, the average value signal may have a similar signal level to the portion corresponding to the side lobes.

The extracted signal generating module 53 may receive the pulse compressed signal from the pulse compressing module 51 and also receive the average value signal from the average value signal generating module 52. Note that at least one of the pulse compressing module 51 and the average value signal generating module 52 may include a delayer, and the pulse compressed signal and the average value signal may be coincided in timing. The extracted signal generating module 53 may perform processing of removing the average value signal from the pulse compressed signal to generate an extracted signal. Note that, since the signal levels of the pulse compressed signal and the average value signal are indicated by logarithm (decibel), the processing performed by the extracted signal generating module 53 may be division processing (similar for processing described below regarding a signal removal).

FIG. 3 illustrates the signal level of the extracted signal, and the spread thereof in the distance direction and the azimuth direction. As illustrated in FIG. 3, since the average value signal is a signal approximating the side lobes of the pulse compressed signal, the side lobes are removed by removing the average value signal from the pulse compressed signal. That is, the extracted signal is a signal obtained by extracting the main lobe from the pulse compressed signal. In JP2012-220449A, the side lobes are removed from the pulse compressed signal by performing such processing.

However, the average value signal has a given signal level also in the portion corresponding to the main lobe of the pulse compressed signal. Therefore, the signal level of the main lobe of the extracted signal is lower than the signal level of the main lobe of the pulse compressed signal. Therefore, the S/N ratio of the reception signal drops. Furthermore, since the average value signal has the shape in which the signal level gradually decreases from the reference azimuth in the azimuth direction, the peak of the main lobe of the extracted signal spread in the azimuth direction from the peak of the main lobe of the pulse compressed signal. Therefore, in this embodiment, the following processing is further performed.

The pseudo signal generating module 54 may receive the extracted signal from the extracted signal generating module 53 and also receive the average value signal from the average value signal generating module 52. The pseudo signal generating module 54 may generate a pseudo signal by removing the extracted signal from the average value signal. Here, the average value signal and the extracted signal may be signals generated from the reception signal (via the pulse compressed signal etc.). Therefore, the pseudo signal may be generated based on the reception signal. Moreover, the extracted signal may be generated using the pulse compressed signal. Therefore, the pseudo signal may be generated based on the pulse compressed signal and the average value signal.

FIG. 4 illustrates the signal level of the pseudo signal, and the spread thereof in the distance direction and the azimuth direction. Moreover, in the pseudo signal, a portion corresponding to the main lobe of the pulse compressed signal is referred to as the pseudo main lobe portion, and portions corresponding to the side lobes of the pulse compressed signal are referred to as the pseudo side lobe portions. Since the extracted signal is the signal from which the main lobe is extracted, the pseudo side lobe portions may have a similar shape to the average value signal. That is, the extracted signal may have a shape in which the signal level gradually decreases from the reference azimuth in the azimuth direction. On the other hand, since the extracted signal is the signal obtained by extracting the main lobe, it may have a high signal level. Since such an extracted signal is removed, the signal level of the pseudo main lobe portion may become extremely low, for example, between zero and a value on the order of a noise floor. Therefore, the signal level of the pseudo main lobe portion may be substantially constant (the change amount of the signal level is on the order of the noise floor) at the reference azimuth and end portions in the azimuth direction.

The side lobe removing module 55 may receive the pseudo signal from the pseudo signal generating module 54 and also receive the pulse compressed signal from the pulse compressing module 51. The side lobe removing module 55 may remove the pseudo signal from the pulse compressed signal to generate the processed signal.

FIG. 4 illustrates the signal level of the processed signal, and the spread thereof in the distance direction and the azimuth direction. Since the signal level of the pseudo main lobe portion of the pseudo signal is substantially zero, the signal level of the main lobe of the processed signal may be similar to the signal level of the main lobe of the pulse compressed signal. Further, since the signal in the pseudo main lobe portion has the similar shape to the side lobes of the pulse compressed signal, the side lobes are substantially removed in the processed signal. By performing the processing of this embodiment as described above, the side lobes may be removed without deteriorating the main lobe of the pulse compressed signal. In this embodiment, the radar image may be generated using this processed signal.

Figure 5:
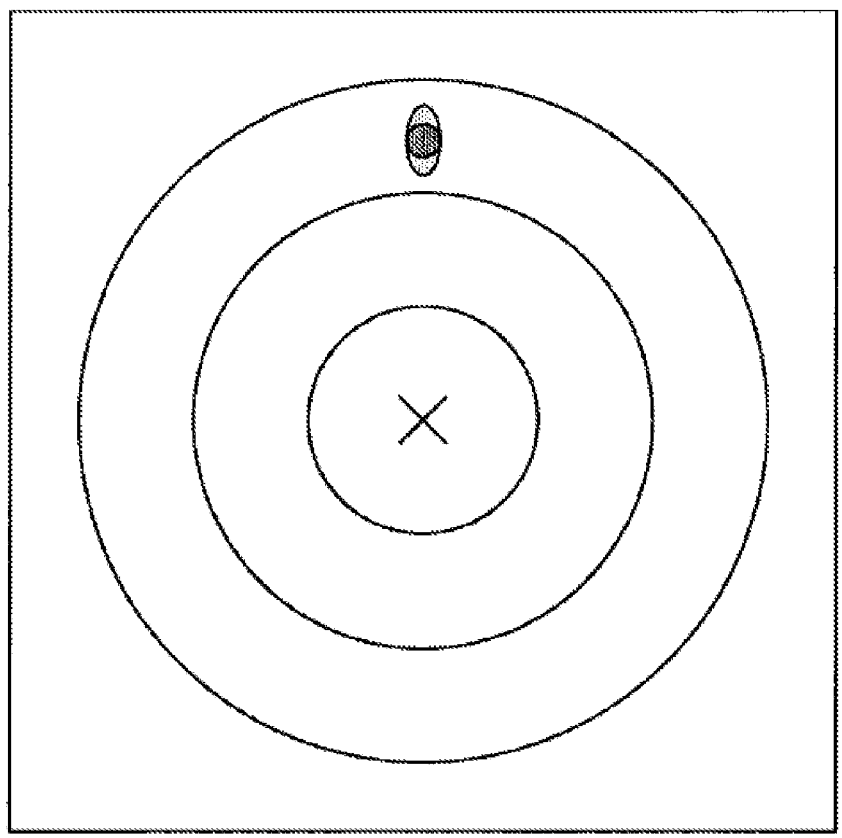
FIG. 5 is a diagram illustrating an echo displayed in a radar image in a conventional example in which a side lobe removing function is not used.

Next, the effects of this embodiment will be described in comparison with conventional examples. First, a radar image generated by a radar apparatus which does not have a function to remove the side lobes (or keeps the function OFF) will be described with reference to FIG. 5. FIG. 5 is a diagram illustrating an echo displayed in a radar image in a conventional example in which the side lobe removing function is not used.

Figure 6:
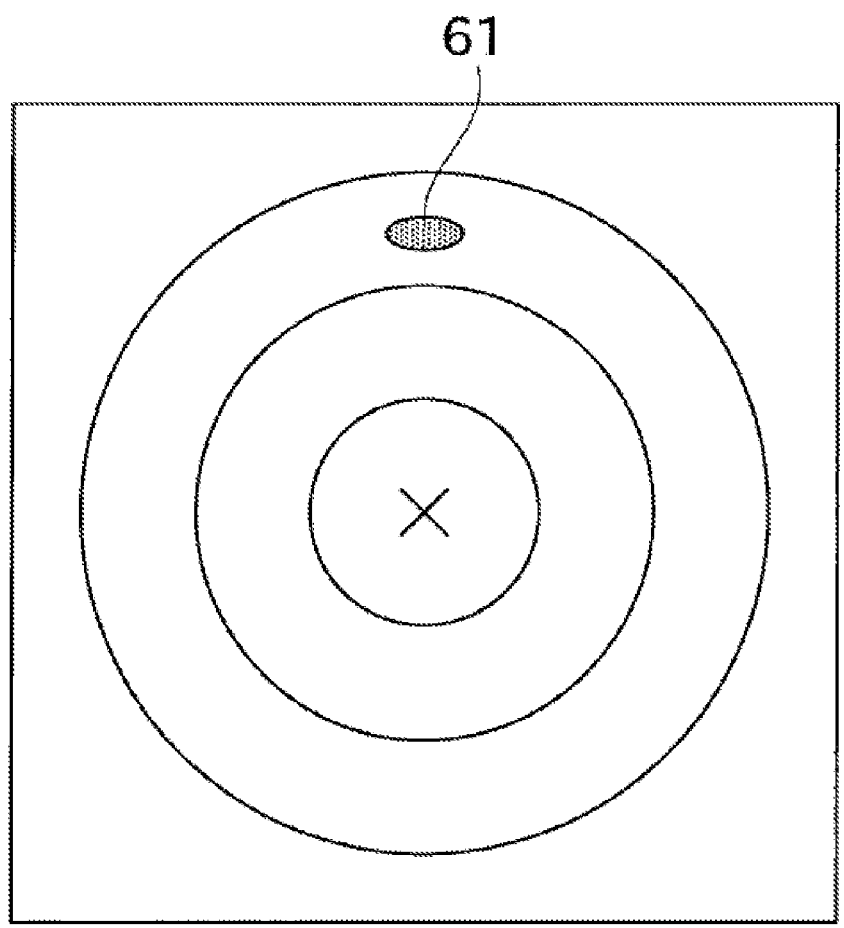
FIG. 6 is a diagram illustrating an echo displayed in a radar image in another conventional example in which the side lobe removing function is not used.
Figure 7:
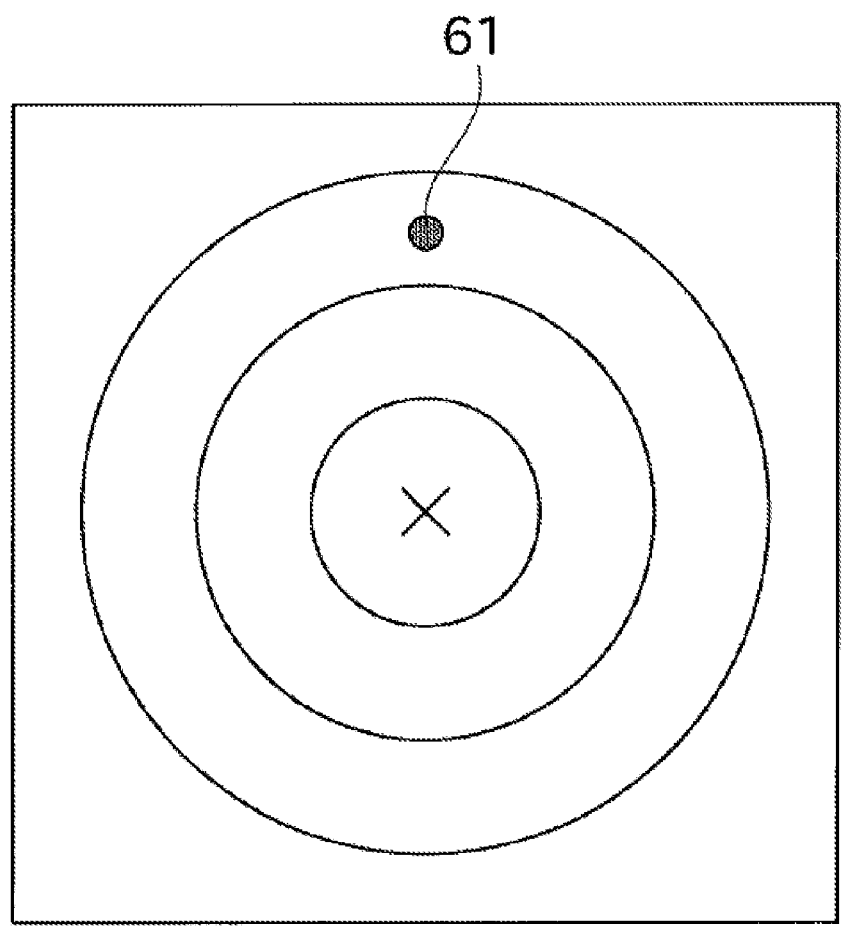
FIG. 7 is a diagram illustrating an echo displayed in a radar image of this embodiment.

Note that, FIGS. 5 to 7 illustrate situations where an echo 61 indicating, for example, another ship is displayed in the radar image. Moreover, the echo 61 in FIGS. 5 to 7 expresses the signal level by shading (specifically, the size and density of dots) of the image. The echo 61 displayed in FIG. 5 includes side lobes extending in the distance direction. Since the signal levels of the side lobes are lower than that of the main lobe, the portion extending in the distance direction is displayed brighter in gray level.

Next, a radar image generated by a radar apparatus which removes side lobes by a conventional method (the radar apparatus of JP2012-220449A) will be described with reference to FIG. 6. FIG. 6 is a diagram illustrating an echo displayed in the radar image in the conventional example in which the side lobe removing function is used.

The radar apparatus of JP2012-220449A generates the radar image by using the extracted signal illustrated in FIG. 3 as the processed signal. Since the main lobe of the extracted signal may have the lower signal level than in the main lobe of the pulse compressed signal as described above, the S/N ratio of the main lobe may drop. Furthermore, since the main lobe of the extracted signal extends longer in the azimuth direction than the main lobe of the pulse compressed signal, the echo 61 may also have a shape similarly extending in the azimuth direction. Thus, the resolution in the azimuth direction degrades. Note that, since the side lobes of the echo 61 illustrated in FIG. 6 are removed, the side lobes illustrated in FIG. 5 is not displayed.

Next, the radar image generated by the radar apparatus 10 of this embodiment will be described with reference to FIG. 7. FIG. 7 is a diagram illustrating an echo displayed in the radar image according to this embodiment.

In this embodiment, by removing the pseudo signal from the pulse compressed signal, the deterioration in the signal level and the peak shape of the main lobe may be prevented while removing the side lobes. Therefore, the echo 61 illustrated in FIG. 7 may not include the side lobes illustrated in FIG. 5. Moreover, in the echo 61 illustrated in FIG. 7, the peak shape of the main lobe of the pulse compressed signal is not spread in the azimuth direction, the shape may not extend in the azimuth direction as illustrated in FIG. 6. Therefore, by displaying the echo 61 in the method of this embodiment, the accurate position of the target object may be displayed, and even when, for example, two target objects are located adjacent to each other in the azimuth direction, since these echoes do not easily overlap, it may become easier to grasp the existence of the two target objects.

Next, another method of generating various signals will be described.

In the above description, the pseudo signal may be generated from the extracted signal and the average value signal. In this regard, the pseudo signal may alternatively be directly generated from the pulse compressed signal. For example, the pseudo signal may be generated by performing processing on the pulse compressed signal to keep the signal level for a portion where the signal level is equal to or less than a given threshold, and reduce the signal level for a portion where the signal level exceeds the given threshold to zero (a value lower than the signal levels of the side lobes).

Further, the extracted signal may also be generated from only the pulse compressed signal by performing similar processing. For example, the extracted signal may be generated by extracting a portion having a signal level equal to or higher than the given threshold (removing a signal component with the signal level lower than the given threshold) from the pulse compressed signal.

Moreover, in the above description, the pseudo signal=the average value signal/the extracted signal, the extracted signal=the pulse compressed signal/the average value signal. Therefore, the pseudo signal=(the average value signal)$^2$/the pulse compressed signal. By using a circuit which achieves this equation, the pseudo signal may be generated without generating the extracted signal in the process.

Furthermore, although in the above description the signal level of the pseudo main lobe portion of the pseudo signal is substantially constant in the azimuth direction (the change amount is on the order of the noise floor), the signal level may be changed in the azimuth direction as long as the signal level is lower than those of the pseudo side lobe portions. Even in this case, the effect of preventing the drop of the S/N ratio of the reception signal may be exerted.

As described above, the signal processing device 13 of this embodiment may include the pulse compressing module 51, the pseudo signal generating module 54, and the side lobe removing module 55, and implement the signal processing method below. The pulse compressing module 51 may generate the pulse compressed signal obtained by performing the pulse compression on the reception signal which is the reflection of the transmission signal transmitted to the outside (pulse compression process). The pseudo signal generating module 54 may generate the pseudo signal of which the pseudo main lobe portion corresponding to the main lobe of the pulse compressed signal has a lower signal level than those of the pseudo side lobe portions corresponding to the side lobes of the pulse compressed signal, based on the reception signal (pseudo signal generation process). The side lobe removing module 55 may remove the pseudo signal from the pulse compressed signal (side lobe removing process).

Thus, since the signal level of the pseudo main lobe portion of the pseudo signal is lower than those of the pseudo side lobe portions, by removing the pseudo signal from the pulse compressed signal, the lowering of the signal level of the main lobe may be prevented, while removing the side lobes from the pulse compressed signal. Thus, the drop of the S/N ratio of the main lobe of the pulse compressed signal may be prevented.

Further, in the signal processing device 13 of this embodiment, when the azimuth at which the main lobe of the pulse compressed signal takes its peak value is the reference azimuth, the signal levels of the pseudo side lobe portions gradually decrease from the reference azimuth in the azimuth direction. The pseudo main lobe portion may have substantially constant signal level at the reference azimuth and the end portions in the azimuth direction.

Thus, since the peak shape in the azimuth direction remains even when the pseudo signal is removed from the pulse compressed signal, the resolution in the azimuth direction may be improved.

Further, in the signal processing device 13 of this embodiment, the pseudo main lobe portion may have a signal level between zero and a value on the order of the noise floor at the reference azimuth and the end portions in the azimuth direction.

As a result, since the signal level of the main lobe does not become low when the pseudo signal is removed from the pulse compressed signal, the drops of the S/N ratio of the main lobe and the resolution in the azimuth direction in the pulse compressed signal may be prevented more reliably.

Further, the signal processing device 13 of this embodiment may include the average value signal generating module 52 configured to generate the average value signal which is one of the moving average value and the weighted average value of the reception signal. The pseudo signal generating module 54 may generate the pseudo signal based on the average value signal and the pulse compressed signal.

Thus, a highly accurate pseudo signal may be generated by using the average value signal.

Moreover, the signal processing device 13 of this embodiment may include the extracted signal generating module 53 configured to generate the extracted signal obtained by extracting the main lobe of the pulse compressed signal. The pseudo signal generating module 54 may generate the pseudo signal by removing the extracted signal from the average value signal.

Thus, the pseudo signal may be generated with simple processing.

Moreover, in the signal processing device 13 of this embodiment, the extracted signal generating module 53 may generate the extracted signal by removing the average value signal from the pulse compressed signal.

Thus, the main lobe may be extracted from the pulse compressed signal with the simple processing.

Although the suitable embodiment of the present disclosure is described above, the above configuration may be modified as follows, for example.

In the above embodiment, the data processing module 43 may be single hardware, but at least one of the pulse compressing module 51 to the pseudo signal generating module 54 may be configured by different hardware.

In the above embodiment, although the example in which the present disclosure is applied to the radar apparatus for the ship is described, the present disclosure may also be applied to a radar apparatus mounted on a movable body (e.g., aircraft) other than the ship. Moreover, the present disclosure may be applied to a radar apparatus installed in a building etc. instead of the movable body. Furthermore, the present disclosure is not limited to the detection device which performs a detection around the device by transmitting and receiving electromagnetic waves, but may also be applied to a detection device which performs a detection around device by transmitting and receiving ultrasonic waves (e.g., an underwater detection device, such as a fish finder and a sonar).

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processor. A processor can be a microprocessor, but in the alternative, the processor can be a controlling module, microcontrolling module, or state machine, combinations of the same, or the like. A processor can include electrical circuitry configured to process computer-executable instructions. In another embodiment, a processor includes an application specific integrated circuit (ASIC), a field programmable gate array (FPGA) or other programmable device that performs logic operations without processing computer-executable instructions. A processor can also be implemented as a combination of computing devices, e.g., a combination of a digital signal processor (DSP) and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controlling module, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow views described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C. The same holds true for the use of definite articles used to introduce embodiment recitations. In addition, even if a specific number of an introduced embodiment recitation is explicitly recited, those skilled in the art will recognize that such recitation should typically be interpreted to mean at least the recited number (e.g., the bare recitation of "two recitations," without other modifiers, typically means at least two recitations, or two or more recitations).

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.).

For expository purposes, the term "horizontal" as used herein is defined as a plane parallel to the plane or surface of the floor of the area in which the system being described is used or the method being described is performed, regardless of its orientation. The term "floor" can be interchanged with the term "ground" or "water surface." The term "vertical" refers to a direction perpendicular to the horizontal as just defined. Terms such as "above," "below," "bottom," "top," "side," "higher," "lower," "upper," "over," and "under," are defined with respect to the horizontal plane.

As used herein, the terms "attached," "connected," "mated," and other such relational terms should be construed, unless otherwise noted, to include removable, moveable, fixed, adjustable, and/or releasable connections or attachments. The connections/attachments can include direct connections and/or connections having intermediate structure between the two components discussed.

Numbers preceded by a term such as "approximately," "about," and "substantially" as used herein include the recited numbers, and also represent an amount close to the stated amount that still performs a desired function or achieves a desired result. For example, the terms "approximately," "about," and "substantially" may refer to an amount that is within less than 10% of the stated amount. Features of embodiments disclosed herein are preceded by a term such as "approximately," "about," and "substantially" as used herein represent the feature with some variability that still performs a desired function or achieves a desired result for that feature.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A signal processing device, comprising:
processing circuitry configured:
to generate
a pulse compressed signal by performing pulse compression of a reception signal that is a reflection of a transmission signal; and a pseudo signal, based on the reception signal, of which a pseudo main lobe portion corresponding to a main lobe of the pulse compressed signal has a lower signal level than signal levels of pseudo side lobe portions corresponding to side lobes of the pulse compressed signal; and to remove the pseudo signal from the pulse compressed signal, and wherein when an azimuth at which the main lobe of the pulse compressed signal takes a peak value is a reference azimuth, the processing circuitry is further configured to generate:

the pseudo side lobe whose signal level gradually decreases from the reference azimuth in the azimuth direction; and the pseudo main lobe whose signal level is substantially constant at the reference azimuth and end portions in the azimuth direction.

2. The signal processing device of claim 1, wherein the processing circuitry is further configured to generate the pseudo main lobe whose signal level is between zero and a value substantially equal to a noise floor at the reference azimuth and the end portions in the azimuth direction.

3. The signal processing device of claim 2, wherein the processing circuitry is further configured to:

generate an average value signal by performing a moving average or a weighted average of the reception signal, and generate the pseudo signal based on the average value signal and the pulse compressed signal.

4. The signal processing device of claim 2, wherein the processing circuitry is further configured to:

generate an average value signal by performing a moving average or a weighted average of the reception signal, generate an extracted signal by removing the average value signal from the pulse compressed signal, and generate the pseudo signal by removing the extracted signal from the average value signal.

5. A radar apparatus, comprising:
the signal processing device of claim 4; and
a radar antenna configured to at least receive the reflection of the transmission signal.

6. The signal processing device of claim 1, wherein the processing circuitry is further configured to:

generate an average value signal by performing a moving average or a weighted average of the reception signal, and generate the pseudo signal based on the average value signal and the pulse compressed signal.

7. The signal processing device of claim 6, wherein the processing circuitry is further configured to:

generate an extracted signal by extracting the main lobe of the pulse compressed signal, and generate the pseudo signal by removing the extracted signal from the average value signal.

8. The signal processing device of claim 7, wherein the processing circuitry is further configured to:

generate the extracted signal by removing the average value signal from the pulse compressed signal.

9. The signal processing device of claim 1, wherein the processing circuitry is further configured to:

generate an average value signal by performing a moving average or a weighted average of the reception signal, generate an extracted signal by removing the average value signal from the pulse compressed signal, and generate the pseudo signal by removing the extracted signal from the average value signal.

10. A radar apparatus, comprising:
the signal processing device of claim 9; and
a radar antenna configured to at least receive the reflection of the transmission signal.

11. A radar apparatus, comprising:
the signal processing device of claim 1; and
a radar antenna configured to at least receive the reflection of the transmission signal.

12. A signal processing method, comprising:
generating a pulse compressed signal by performing pulse compression of a reception signal that is a reflection of a transmission signal;

generating a pseudo signal, based on the reception signal, of which a pseudo main lobe portion corresponding to a main lobe of the pulse compressed signal has a lower signal level than signal levels of pseudo side lobe portions corresponding to side lobes of the pulse compressed signal;

removing the pseudo signal from the pulse compressed signal; and when an azimuth at which the main lobe of the pulse compressed signal takes a peak value is a reference azimuth:

generating the pseudo side lobe whose signal level gradually decreases from the reference azimuth in the azimuth direction; and generating the pseudo main lobe whose signal level is substantially constant at the reference azimuth and end portions in the azimuth direction.

13. A signal processing device, comprising:
processing circuitry configured:
to generate
a pulse compressed signal by performing pulse compression of a reception signal that is a reflection of a transmission signal;

a pseudo signal, based on the reception signal, of which a pseudo main lobe portion corresponding to a main lobe of the pulse compressed signal has a lower signal level than signal levels of pseudo side lobe portions corresponding to side lobes of the pulse compressed signal;

an average value signal by performing a moving average or a weighted average of the reception signal;

an extracted signal by removing the average value signal from the pulse compressed signal; and the pseudo signal by removing the extracted signal from the average value signal; and to remove the pseudo signal from the pulse compressed signal.

14. A radar apparatus, comprising:
the signal processing device of claim 13; and
a radar antenna configured to at least receive the reflection of the transmission signal.

* * * * *